May 21, 1968 L. SCHWARTZ 3,384,864

ELECTRICAL CONNECTOR ASSEMBLY

Filed Nov. 15, 1965 2 Sheets-Sheet 1

INVENTOR
LEON SCHWARTZ

BY [signature]

AGENT 3,384,864
ELECTRICAL CONNECTOR ASSEMBLY
Leon Schwartz, Philadelphia, Pa., assignor to Sperry Rand Corporation, New York, N.Y., a corporation of Delaware
Filed Nov. 15, 1965, Ser. No. 507,787
6 Claims. (Cl. 339—176)

ABSTRACT OF THE DISCLOSURE

A miniaturized connector asesmbly for an electronic circuit board is disclosed. A connector assembly includes a connector block secured along one edge of the circuit board. The block contains a plurality of sockets each of which is formed from a flat spring wire stock wound in a helical manner and further shaped so that the helical spring follows a serpentine path. The spring has a tail section that extends through the connector block and is soldered to the circuit board wiring. The sockets cooperate with a series of rectangular pin connectors which are carried by a second block and arranged so that the pins can be inserted in the sockets to form a good reliable electrical connection between the pins and the sockets.

The invention hereinafter described and claimed has to do with connectors for electrically and mechanically interconnecting electrical circuit elements, but more particularly to push-pull type separable electrical connectors for connecting electrical networks printed or otherwise defined on printed circuit boards, with electrical circuitry external of the printed circuit boards.

Electrical interconnection of circuits on printed circuit boards with external circuitry while having reached a high state of sophistication, still leaves important areas for improvement. For example, newly developed advanced high speed circuitry for computers require printed circuit connectors having a high degree of reliability and an extremely high density (close spacing) of connections in order to accommodate the multiple circuit elements now being jammed on such boards by reason of component miniaturization. This requirement necessitates a degree of connector miniaturization difficult to acquire without sacrifice of reliability and ease of making and breaking the interconnection.

The present invention has as its primary object to provide an improved electrical connector assembly fulfilling the needs described above, and featured by: its exceptional reliability; its novel construction affording assembly in exceptionally high density arrays; its adjustable insertion and extraction (push-pull) forces; its self-alignment of mating parts; its low contact resistance; and the easy removal and replacement of defective elements of the assembly.

In accordance with the above, and first briefly described, the invention comprise a pin, or stud, rectangular in cross-section, for mounting on a back-board wiring plane in position to engage a mating socket mounted within an enlarged bore so that it can "float" in a circuit connector block secured along one edge of a printed circuit board. Each socket is formed of flat spring wire stock rectangular in cross-section, wound in tightly adjoining convolutions through an offset or serpentine path. A tail portion extends through the connector block to be soldered or otherwise connected to circuit elements on the board. The mating pin and socket assembly is of miniature size permitting assembly in high density multiple arrays, while the unique floating spring wound socket provides a wide latitude of tolerance in pin alignment without sacrifice of reliability, and its serpentine configuration and rectangular cross-section combined with its resilience assures line contact of each convolution with at least two corners of the pin.

Figures 4, 5, 8:
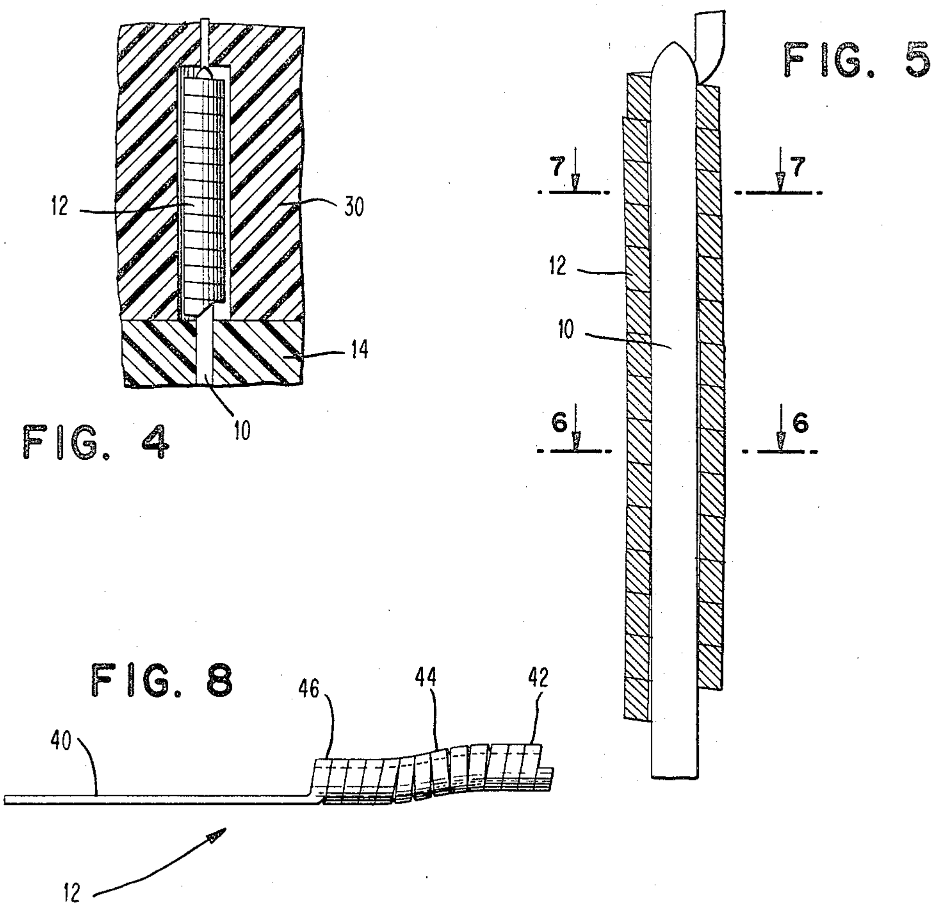
FIGURE 4 is similar to FIGURE 3 but shows the connector parts after interconnection.
FIGURE 5 is an enlarged sectional view of the mated connector elements.
Figure 6:
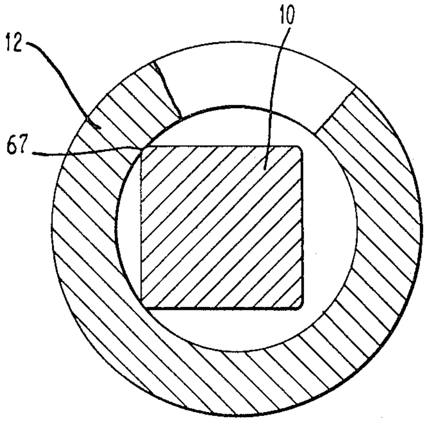
Figure 7:
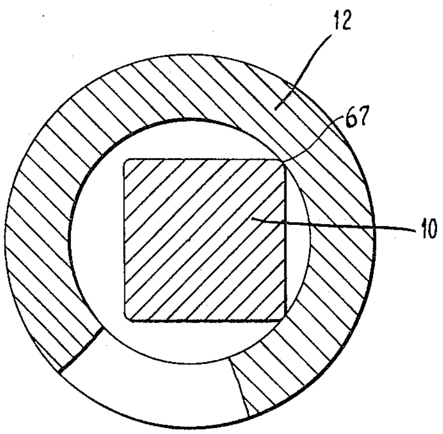

FIGURES 6 and 7 are sectional views taken along lines 6—6 and 7—7 respectively of FIGURE 5; and FIGURE 8 is an elevational view of the socket connector element prior to assembly in the connector block.

Figure 2:
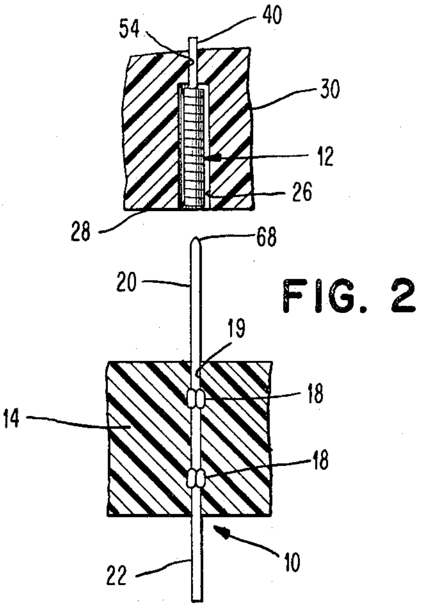
FIGURE 2 is an exploded elevational view of elements of the connector assembly.

With particular attention now to the various details of the drawing and first to FIGURE 2, it is seen that basic elements of the connector assembly, in accordance with this illustrated preferred embodiment of the invention, comprises the stud or pin 10 and the socket 12, both made of electrically conductive material.

Figure 1:
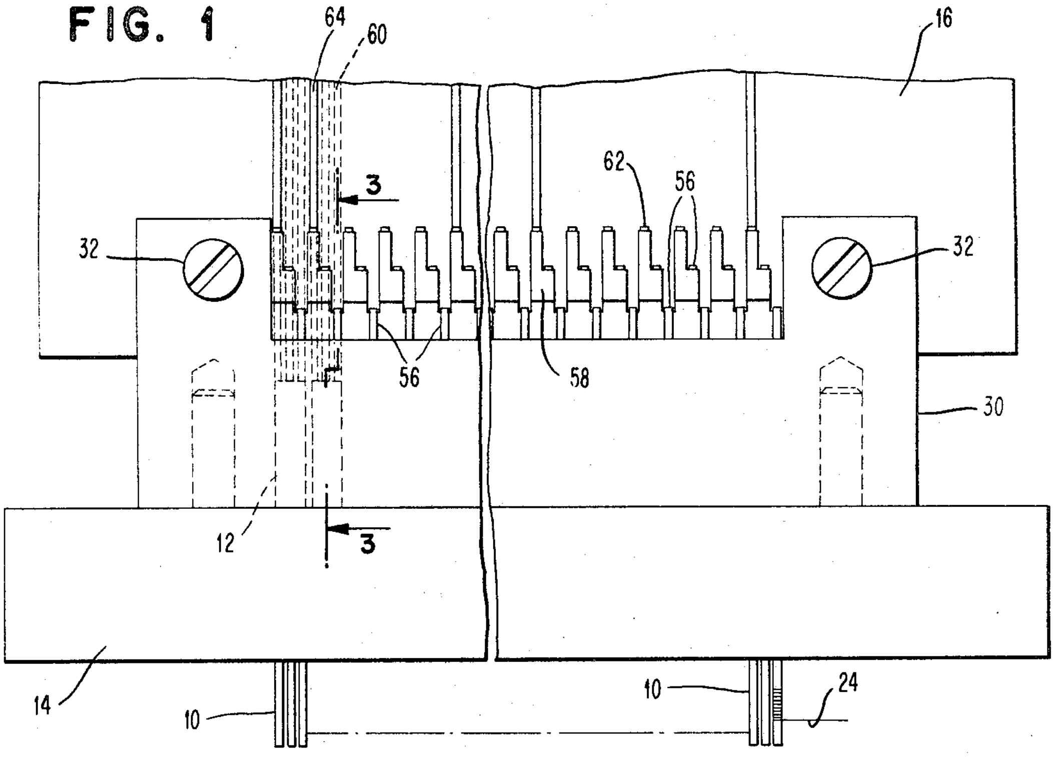
FIGURE 1 is an elevational view of the apparatus embodying the invention.

Normally, as seen in FIGURE 1, a plurality of the pins 10 would be arranged in closely spaced rows in the backboard 14 whereby a number of printed circuit boards 16 may be closely assembled thereon. In this preferred form of the invention, the pins are arranged in three sets of rows, each set comprising three adjacent rows.

Each pin 10 is rectangular in cross section, preferably square, as shown in FIGURES 5, 6 and 7, and is provided with spaced pinched projections 18 along its length (FIGURE 2) to retain it against accidental displacement from its position in backboard 14. Preferably, the pins are made of Phosphor bronze.

The pins may be molded in place, but it is preferred that the backboard be pre-formed with square apertures 19 (FIGURE 2) through which the pins will be forced for tight fit, thus to align them in the molded block. Projections 18 dig into the side walls of the apertures to hold the pins in place. End portions 20 and 22 extend from opposite sides of the backboard for connection with the socket 12 on one side and for wrap attachment, on the other side, of wires 24 from associated electrical equipment or components (not shown). Only one wire 24 has been shown by way of example.

The sockets 12 are mounted in bores or apertures 26 in the bottom wall 28 of a board connector block 30 secured to one edge of the printed circuit board 16, as by screws 32 (FIGURE 1). The board is mounted with its lower edge seated in a groove 33 (FIGURE 3) and with its outer face 36 substantially flush with the outer face 38 of block 30, thus to afford close mounting of adjacent board assemblies on backboard 14. The number and arrangement of sockets in the connector block are the same as the number and arrangement of pins in each set of pin rows.

As seen in FIGURE 2, the socket 12 is formed in a serpentine path by tightly wound convolutions of one end of a single strand of flat flexible electrically conductive wire, such as beryllium copper, which is rectangular in cross-section. The convolutions are wound with one flat surface of the wire facing inwardly thereby to provide a substantially smooth surface for insertion of the pins 20. The other end of the wire forms an elongaetd tail 40. As seen in FIGURE 8, the pin insertion end 42 of the socket 12 is offset at 44 relative to the upper end 46. The offset 44 starts at the third complete convolution and ends at the ninth. The axes of the straight end portions 42 and 46 preferably are parallel.

By way of example, the wire forming the socket 12 may be of .010" x .020" beryllium copper stock. The outer diameter of the socket may be .055" with an offset of .025" for a total transverse dimension of .080" in one direction (FIGURE 8). Pin insertion force is, of course, largely controlled by the offset, being maximum at the maximum offset dimension indicated above. However, it is contemplated to regulate this force by the size of the socket aperture 26. Ideally the aperture will have a diameter of .067" thus to effect a slight reduction in the offset 44 and a consequent slight straightening of the connector 12 reducing the pin insertion force to less than maximum. The closer the aperture diameter approaches the socket diameter the less will be the pin insertion force required.

Figure 3:
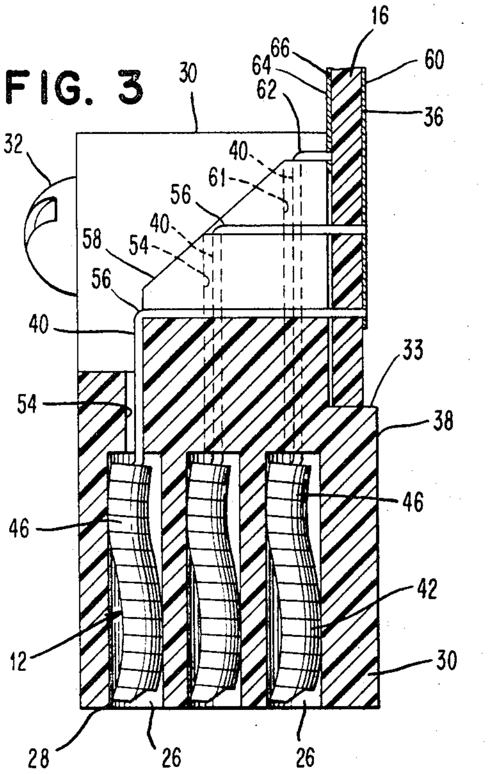
FIGURE 3 is an enlarged sectional view of the socket element of the connector assembly prior to mating of the parts and rotated 90° from the position shown in FIGURE 2.

In mounting a socket in its aperture 26, the end of its tail 40 is passed through one of the apertures and a connecting passageway 54 until the socket is fully within the aperture, as seen in FIGURE 3. As mentioned above each of the apertures preferably is of larger diameter than the socket 12 whereby the socket is afforded a degree of transverse or pivotal motion within its aperture about its juncture with tail 40 as a pivot.

In FIGURE 3, it is seen that the upper ends 56 of the tail portion in each row of pins are bent over between adjacent spacing abutments 58. Two rows extend through the board 16 for solder connection to circuit elements 60 on its outer face. The tails 40 in the other row extend through passageway 61 in the abutments 58 with their upper ends 62 bent over for solder connection to circuit elements 64 on the inner face 66 of the board. Bending of the tail portions where they emerge from passageways 54 and 61 secures the sockets in the apertures.

Entry of a pin in its socket flexes the convolution on the socket thus to effect a tight grip of each convolution on the pin at least at two of its sharp corner edges 67 (FIGURES 6 and 7), while sliding of the pin edges over convolutions cleans the contact points by an abrasive action, actually wearing away the sharp corners of the pins. Thus it can be understood that good conductive contact is obtained at each of the multiple contact points for increased reliability. For a socket of twelve convolutions this means twenty-four points of contact for ultra reliabiliy.

The "floating" mounting of the socket in the apertures provides tolerance for an ample degree of misalignment of its mating pin. When the board assembly is moved into engagement with the pins with misalignment of socket and pin, it is only necessary that some portion of the end opening of the socket be aligned with the tapered end 68 of the pin end 20. In such cases the socket will be urged to pivot, or "float" over until sufficiently aligned to receive the pin.

Removal of a defective socket from the board assembly is accomplished simply by cutting the tail portion where it emerges from its passageway in the board connector 30. The socket then can be pulled from its aperture, and the remaining tail portion removed by applying a hot soldering iron to its solder connection on the board and pulling it from the abutments 58.

In one practical embodiment of the invention illustrating the high density arrangement of which the invention is capable, the pins are .0250" square and mounted in rows and columns on .100" centers. With this spacing and arrangement of pins the three sets of rows comfortably accommodate 378 pins in a backboard area 4.16" x .84" roughly three and one-half square inches. Insertion and extraction forces were in the range of twelve to twenty pounds.

From the above it can now be understood that the connector assembly of this invention provides many unique features not heretofore found in the connector art.

The embodiments of the invention in which an exclusive property or privilege is claimed are defined as follows:

1. An electrical connector assembly comprising:
(A) an electrically insulating connector block having an aperture in one surface and a passageway from the bottom of the aperture to another surface;
(B) a unitary connector element of flexible electrically conductive flat wire;
(C) said connector having a tubular socket portion positioned within said aperture with an open outer end adjacent the entrance of said bore;
(D) said socket portion being formed in a serpentine path which is offset in one direction only by tightly wound convolutions of said wire and a tail portion extending through said passageway for connection to electrical circuit elements at another surface of said connector block;
(E) said socket fitting into said aperture in a manner permitting pivotal floating movement thereof within said bore about its connection with said tail portion as a pivot;
(F) an electrically insulating terminal member; and
(G) an elongated terminal pin rectangular in cross-section and of electrically conductive material mounted in said terminal member with at least one end portion extending therefrom for insertion within said socket to engage convolutions of said tubular socket portion at corners of said pin;
(H) the said floating mounting of said socket permitting a wide tolerance in alignment of the pin with the socket upon insertion.

2. An electrical connector according to claim 1 wherein:
(A) said tightly wound convolutions are made with one flat surface of said flat wire facing inwardly to form a substantially smooth inner surface for the insertion of said terminal pin.

3. A construction according to claim 1 wherein:
(A) said aperture has a diameter less than the outer diameter of said socket plus the amount of offset.

4. A construction according to claim 3 wherein:
(A) said aperture has a diameter greater than the outer diameter of said socket.

5. A construction according to claim 1 wherein:
(A) the offset of said tubular socket is between straight sections thereof whose axes are parallel.

6. An electrical connector element comprising:
(A) a tubular socket portion formed by tightly wound convolutions of a flat electrically conductive wire; and
(B) a tail portion extending from one end;
(C) said socket being formed with a lateral offset in one direction and in which the lateral offset is between straight sections of said socket whose axes are parallel;
(D) said convolutions are made with one flat surface of said wire facing inwardly to form a substantially smooth inner surface for the insertion of a mating connector pin.

References Cited

UNITED STATES PATENTS

| | | | |
|---|---|---|---|
| 1,423,541 | 7/1922 | Rockwell. | |
| 3,058,083 | 10/1962 | Schneider | 339—176 XR |
| 3,205,468 | 9/1965 | Henschen | 339—256 XR |
| 3,209,311 | 9/1965 | Kukla | 339—258 |
| 3,320,572 | 5/1967 | Schwartz | 339—64 XR |

FOREIGN PATENTS

| | | |
|---|---|---|
| 227,101 | 12/1925 | Great Britain. |

MARVIN A. CHAMPION, *Primary Examiner.*
P. A. CLIFFORD, *Examiner.*